United States Patent
Ichinose

(10) Patent No.: US 6,246,117 B1
(45) Date of Patent: Jun. 12, 2001

(54) SEMICONDUCTOR DEVICE COMPRISED OF A BALL GRID ARRAY AND AN INSULATING FILM WITH PREFORMED LAND OPENINGS

(75) Inventor: Michihiko Ichinose, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/460,696

(22) Filed: Dec. 14, 1999

(30) Foreign Application Priority Data

Dec. 15, 1998 (JP) .................................. 10-356169

(51) Int. Cl.[7] ........................ H01L 23/12; H01L 23/48; H01L 23/495
(52) U.S. Cl. .................. 257/738; 257/737; 257/692; 257/693; 257/676; 257/698; 257/780; 257/208; 257/210
(58) Field of Search ..................................... 252/737, 738, 252/734, 778–781, 692, 693, 698, 792, 676, 646, 208, 218

(56) References Cited

U.S. PATENT DOCUMENTS 5,729,051 * 3/1998 Nakamura ............................. 257/668
5,974,912 * 11/1999 Fukutami et al. ..................... 438/110
5,999,413 * 12/1999 Ohuchi et al. ........................ 257/684
6,011,694 * 1/2000 Hirakawa .............................. 257/707
6,013,953 * 1/2000 Nishihara et al. .................... 257/778
6,020,218 * 2/2000 Shim et al. ........................... 438/111
6,071,755 * 6/2000 Baha et al. ........................... 438/106
6,084,300 * 7/2000 Oka ...................................... 257/730
6,097,101 * 8/2000 Sato et al. ............................ 257/787

FOREIGN PATENT DOCUMENTS 9-246427   9/1997   (JP) .
10-84055   3/1998   (JP) .

* cited by examiner

Primary Examiner—Alexander O. Williams
(74) Attorney, Agent, or Firm—Scully, Scott, Murphy & Presser

(57) ABSTRACT

A semiconductor device of a BGA (Ball-Grid-Array) package comprises a lead frame, a semiconductor chip, bonding wires, a plastic, an insulation film, and solder balls. The semiconductor chip is mounted on one side of the lead frame, and is electrically connected to the lead frame by the bonding wires. The plastic encapsulates the semiconductor chip and the bonding wires. The insulation film has openings for exposing predetermined regions of the lead frame. The insulation film is affixed onto an underside surface of the lead frame. The solder balls act as connection terminals. The solder balls are formed on the regions of the lead frame exposed through the openings in the insulation film.

5 Claims, 6 Drawing Sheets

SEMICONDUCTOR DEVICE COMPRISED OF A BALL GRID ARRAY AND AN INSULATING FILM WITH PREFORMED LAND OPENINGS

BACKGROUND OF THE INVENTION

1. Field of the Invention

The present invention relates to a semiconductor device and a manufacturing method of the semiconductor device.

2. Description of the Related Art

A BGA (Ball-Grid-Array) type semiconductor package has been known as a semiconductor package for a semiconductor device.

Such the semiconductor device comprise a lead frame, a semiconductor chip, bonding wires, and solder balls.

The semiconductor chip is mounted on one side of the lead frame with wire bonding which establishes electrical connection. The solder balls are disposed on an underside portion of the lead frame at predetermined intervals, and act as connection terminals of the semiconductor device. The semiconductor chip and the bonding wires are encapsulated with a plastic (resin).

The solder balls are melted when the semiconductor device is mounted on a printed circuit board, thus the solder balls are connected to the printed circuit board. As a result, electrical connection between the semiconductor chip and the printed circuit board is established.

Conventionally, there are two typical ways to form a region (land) of the lead frame on which the solder balls are disposed as follows.

1) Half Etching (disclosed in Unexamined Japanese Patent Application KOKAI Publication No. H9-246427): To etch regions, which do not correspond to portions to be the lands, on one side of the lead frame to predetermined depth (do not etch fully) to form the land portions. Then the semiconductor chip is mounted on the other side of the lead frame with wire bonding. The mounted chip and the bonding wires are encapsulated with a plastic. The encapsulant plastic also covers the half-etched portions, thus the lands are exposed. Finally, the solder balls are formed on the lands.

2) Limited Encapsulation (disclosed in Unexamined Japanese Patent Application KOKAI Publication No. H10-84055): To encapsulate the semiconductor device wholly except regions to be the lands. More precisely, after the chip is mounted on the lead frame, the semiconductor device is subjected to encapsulation process with using a mold which has projected portions corresponding to the regions to be the lands. The semiconductor package is wholly encapsulated except the land regions by injecting an encapsulant plastic. Thus, the lands are exposed, and the solder balls are formed on the lands.

According to the first method, the lead frame is weakened because of the half etching. Therefore, jamming tends to occur during the manufacturing process. As a result, this method costs much because yield of the semiconductor device is poor.

The second method also has disadvantages. The available minimum intervals among the projected portions may be 0.6 mm. Therefore, this method is not suitable for manufacturing a semiconductor package in which lands are formed at intervals equal to or less than 0.6 mm. Moreover, various molds are required in accordance with various sizes of the solder balls, land intervals, and the like. This method also costs much.

SUMMARY OF THE INVENTION

It is an object of the present invention to provide a semiconductor device and a manufacturing method of the semiconductor device which save manufacturing costs. It is another object of the present invention to provide a manufacturing method of a semiconductor device with excellent yield. It is a further object of the present invention to provide a manufacturing method of a semiconductor device which flexibly corresponds to modification of connection terminals' intervals.

To accomplish the above objects, a semiconductor device according to a first aspect of the present invention is a semiconductor device comprises:

a lead frame;

a semiconductor chip mounted on one side of the lead frame;

wires which electrically interconnects the semiconductor chip and the lead frame;

an insulation film, formed on the other side of the lead frame, which has openings for exposing predetermined portions of the lead frame; and connection terminals formed on the predetermined portions of the lead frame which are exposed by the insulation film.

According to the invention, the regions for the connection terminals are exposed through the openings in the insulation film. That is, the insulation film determines the regions. Therefore, the lead frame itself is not influenced at all for exposing the regions for forming the connection terminals because the lead frame is not processed. As a result, manufacturing of the semiconductor device with excellent yield is realized with low cost.

The insulation film may be affixed onto the other side of the lead frame.

Each of the openings in the insulation film may have diameter which is substantially the same as diameter of corresponding connection terminals.

The insulation film may have at least one of thermosetting property and thermo plasticity.

The connection terminals may be made of solder.

A manufacturing method of a semiconductor device according to the second aspect of the present invention is a method comprises:

preparing a lead frame;

mounting a semiconductor chip on one side of the lead frame;

electrically connecting the semiconductor chip and the lead frame by wires;

applying an insulation film, which has openings for exposing predetermined portions of the lead frame, onto the other side of the lead frame; and forming connection terminals on the predetermined portions of the lead frame exposed through the openings in the insulation film.

The applying the insulation film may include affixing the insulation film onto the lead frame.

The applying the insulation film may include applying the insulation film having the openings each of whose diameter is substantially the same as diameter of corresponding connection terminal.

The applying the insulation film may include encapsulating the semiconductor chip and the wires with a plastic before applying the insulation film.

The forming the connection terminals may include forming the connection terminals made of solder.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

A semiconductor device according to an embodiment of the present invention will now be described with reference to accompanied drawings.

Figure 1:
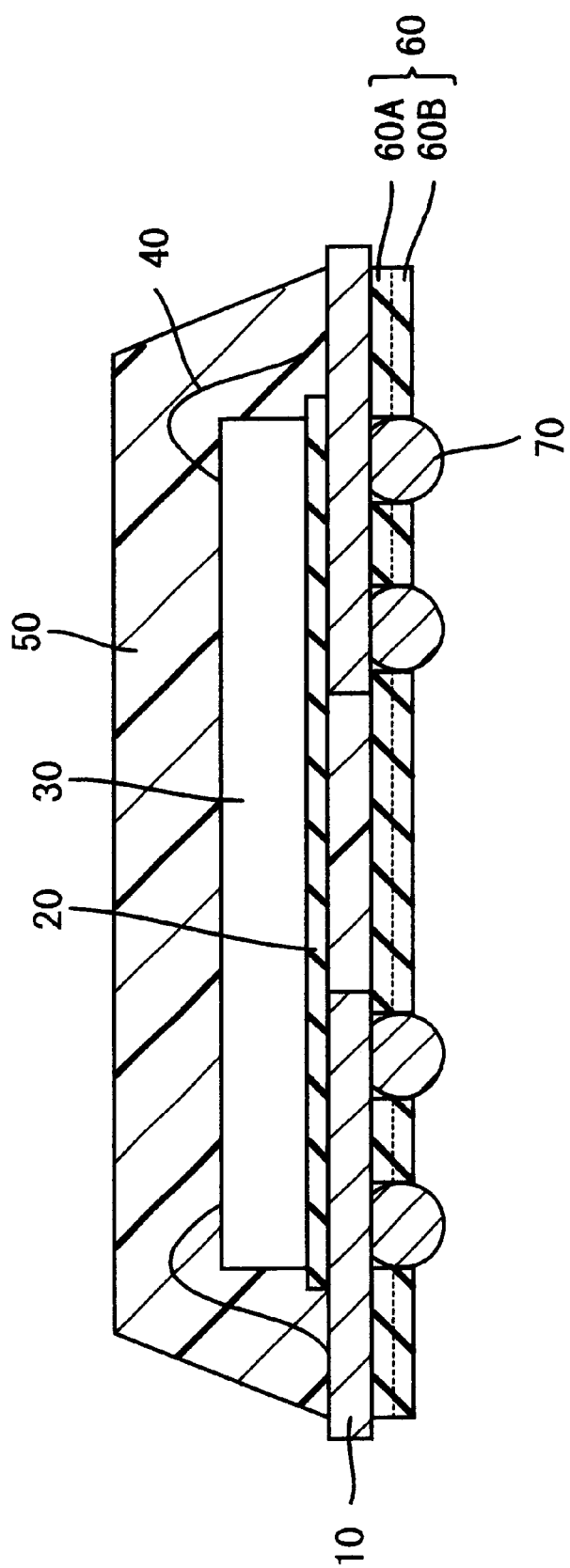
FIG. 1 is a cross sectional view showing the structure of a semiconductor device according to an embodiment of the present invention.

A semiconductor device according to the embodiment of the present invention comprises a BGA (Ball-Grid-Array) type semiconductor package including a semiconductor chip. In detail, the semiconductor device comprises a lead frame 10, a first insulation tape 20, a chip 30, bonding wires 40, a plastic (resin) 50, a second insulation tape 60, and solder balls 70, as shown in FIG. 1.

Figure 2:
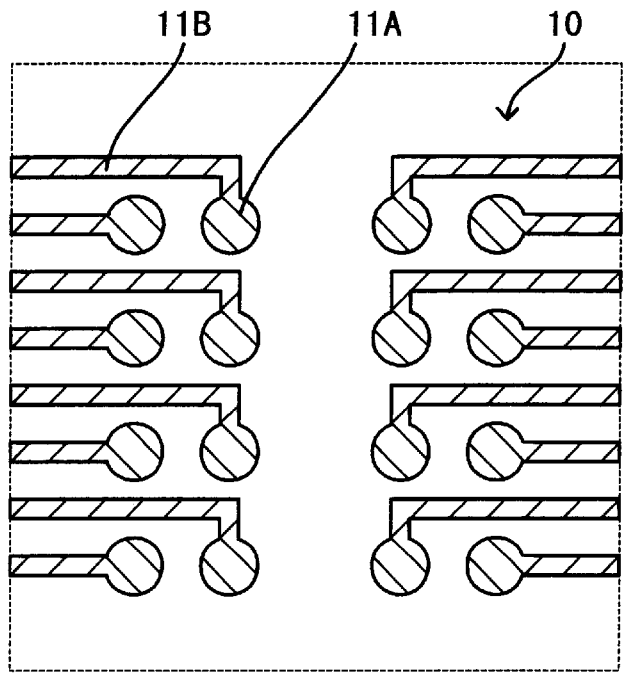
FIG. 2A is a diagram showing the structure of a lead frame in the semiconductor device shown in FIG. 1.
FIG. 2B is a diagram showing the lead frame in early stages of the manufacturing process.
FIG. 2C is a diagram showing the structure of a second insulation tape in the semiconductor device shown in FIG. 1.
Figure 2:
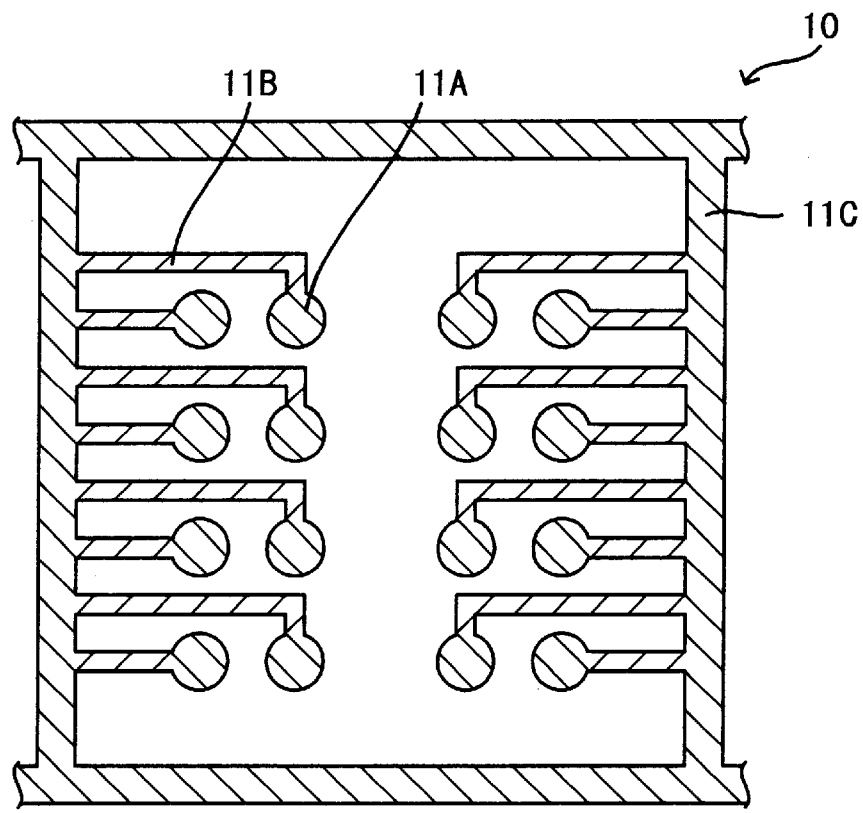
Figure 2:
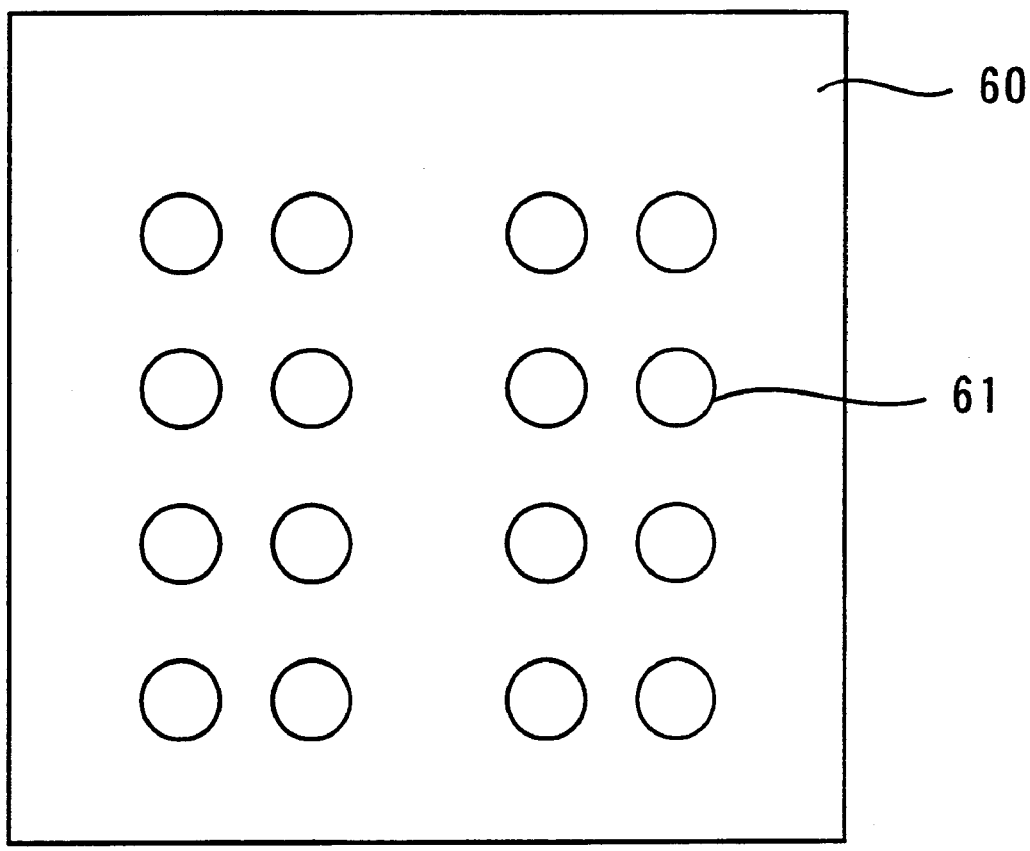

The lead frame 10 is made of a conductive film having a predetermined pattern. For example, FIG. 2A shows a pattern of the conductive film. The conductive film has lands 11A on which the solder balls 70 are formed, and leads 11B for establishing electrical connection between the solder balls 70 and the chip 30. The lead frame 10 includes a frame 11C for supporting the leads 11A in early stages of the manufacturing process. The frame 11C is eliminated in a later stage of the manufacturing process. Thus, the lead frame 10 is divided into a plurality of conductive pieces each including the land 11A and lead 11B. That is, FIG. 2A shows the lead frame 10 after the frame elimination. Note that hatched portions in FIGS. 2A and 2B just represent regions, not represent cross sections.

The first insulation tape 20 is made of, for example, polyimide, and is affixed onto one side of the lead frame 10 so that the leads 11B are exposed partially.

The chip 30 is a semiconductor chip. The chip 30 is mounted on the lead frame 10 with sandwiching the first insulation tape 20 therebetween.

The bonding wires 40 are made of, for example, gold (Au). The bonding wires 40 electrically interconnect electrodes of the chip 30 and exposed leads 11B.

The plastic 50 acts as an encapsulant for encapsulating the chip 30 and bonding wires 40. The plastic 50 also fills a region among the plurality of conductive pieces of the lead frame 10.

The second insulation tape 60 has a dual-layer structure including a bond layer 60A and an insulation layer 60B. The second insulation tape 60 is formed on an underside surface of the lead frame 10. The bond layer 60A has at least one of thermo plasticity and thermosetting property. The bond layer 60A is affixed onto the lead frame 10 by bond. The insulation layer 60B is made of an insulation material (such as polyimide), and is formed on the bond layer 60A. As shown in FIG. 2C, the second insulation tape 60 has openings 61 which substantially correspond to the lands 11A of the lead frame 10. The size of each opening 61 is substantially the same as that of each land 11A. The second insulation tape 60 exposes the lands 11A through the openings 61 while electrically insulating the leads 11B.

The solder balls 70 are connection terminals of the semiconductor device. The diameter of each solder ball 70 is substantially the same as the diameter of each exposed land 11A. The solder balls 70 are formed on the lands 11A. When the solder balls 70 are melted due to mount the semiconductor device on the printed circuit board or the like, the second insulation tape 60 prevents the solder balls 70 from being connected to each other.

Manufacturing steps of thus structured semiconductor device will now be described.

FIGS. 3A to 3F are cross sectional views showing steps of the manufacturing process.

Figure 3A:
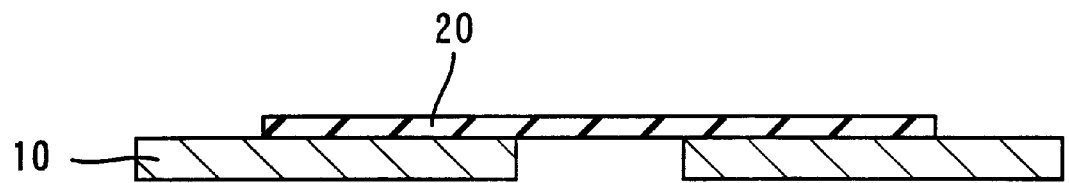
FIGS. 3A to 3F are cross sectional views showing steps of manufacturing the semiconductor device shown in FIG. 1.
Figure 3B:
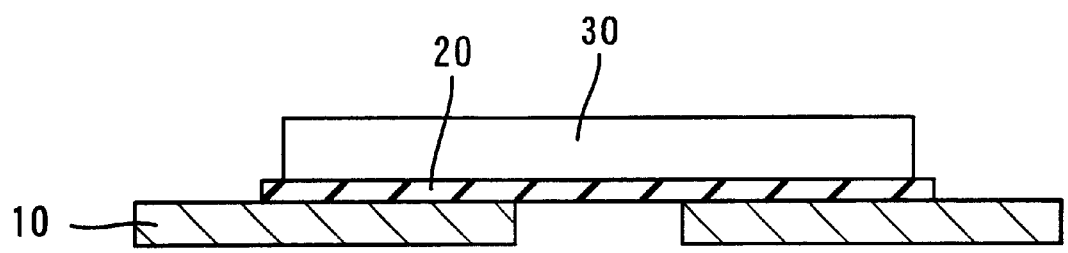

As shown in FIG. 3A, the first insulation tape 20 is affixed onto a predetermined position on the given lead frame 10. Then, the chip 30 is mounted on the first insulation tape 20 as shown in FIG. 3B.

Figure 3C:
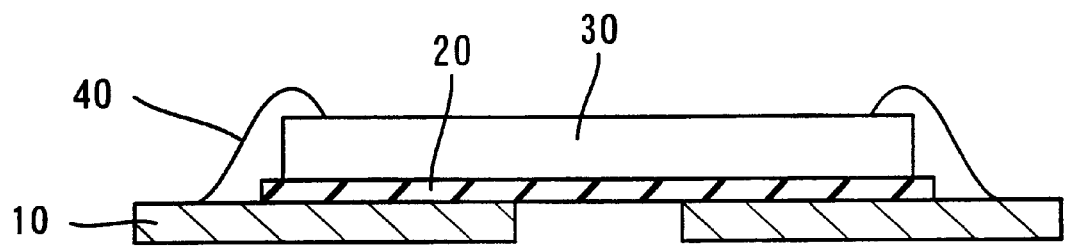

The bonding wires 40 electrically interconnect the electrodes of the chip 30 and the leads 11B of the lead frame 10 as shown in FIG. 3C.

Figure 3D:
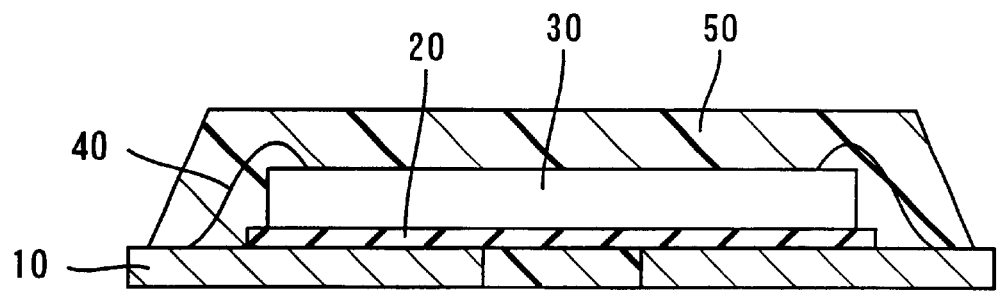

After the manufacturing step shown in FIG. 3C is completed, the semiconductor device is installed in, for example, a mold. And the plastic 50 is injected into the mold to encapsulate the chip 30 and bonding wires 40, as shown in FIG. 3D. At that time, a region among the conductive pieces of the lead frame is filled with the plastic 50.

Figure 3E:
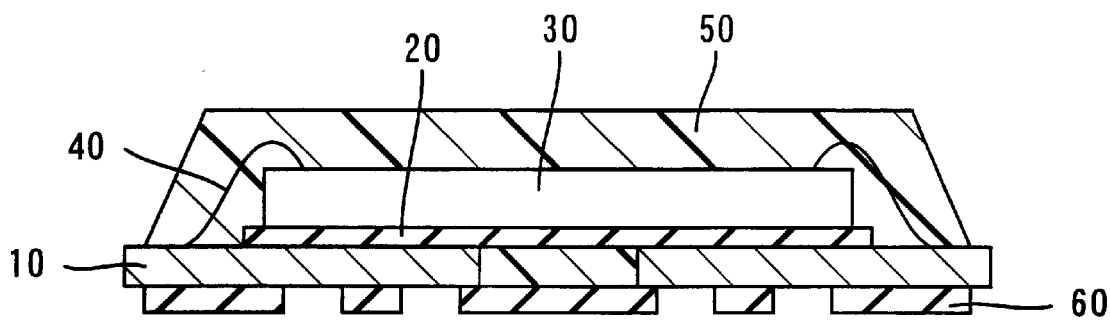

Then the second insulation tape 60 is affixed onto an underside surface of the lead frame 10 as shown in FIG. 3E, that is, onto a reverse side of the side to which the chip 30 is mounted. The affixed second insulation tape 60 exposes the lands 11A while electrically insulating the leads 11B.

Figure 3F:
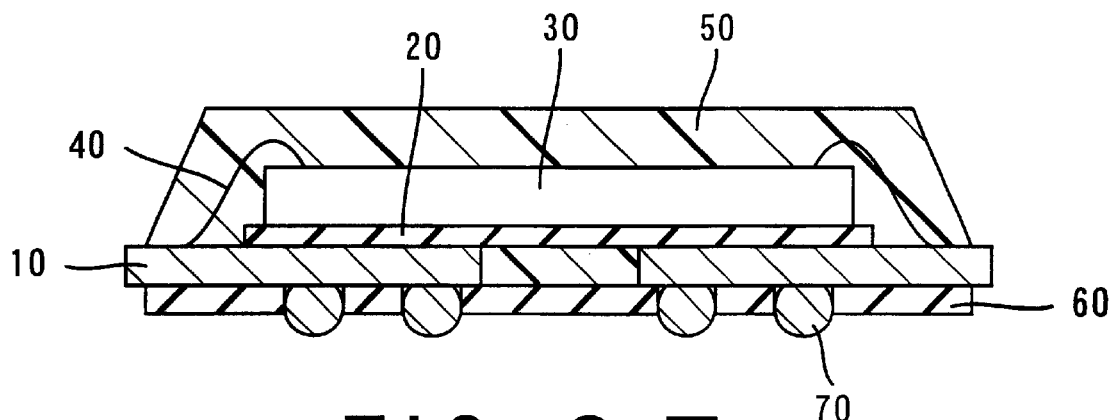

Finally, the solder balls 70 are formed on the exposed lands 11A as shown in FIG. 3F, and the semiconductor device is completed. The frame 11C of the lead frame 10 is cut away at a suitable timing, for example, before or after the encapsulation step (FIG. 3C), after the formation step of the solder balls 70, or the like.

As described above, the regions (lands 11A) prepared for forming the solder balls 70 are exposed through the openings 61 in the second insulation tape 60 affixed to the lead frame 10. This structure does not weaken the strength of the lead frame 10 even if the lands 11 are exposed. Therefore, the manufacturing with excellent yield is realized. Moreover, this structure merely requires a simple mold (projecting portions, or the like are not required). Therefore, costs for manufacturing the semiconductor device are saved.

This structure allows easy modification in accordance with changes in positions or intervals of the lands 11A. Requirements for such the modification are merely changing positions or intervals of the openings 61 in the second insulation tape 60. Even if the interval among the lands 11A is small (for example, equal to or smaller than 0.6 mm), the solder balls 70 can be formed at predetermined positions precisely by such the easy modification applied to the second insulation tape 60. According to this structure, modification of the mold in accordance with the changes in the positions or intervals of the lands 11A is unnecessary. As a result, cost saving is realized. Additionally, the above structure is suitable for manufacturing various semiconductor devices corresponding to variations of intervals of the solder balls 70.

Figure 4A:
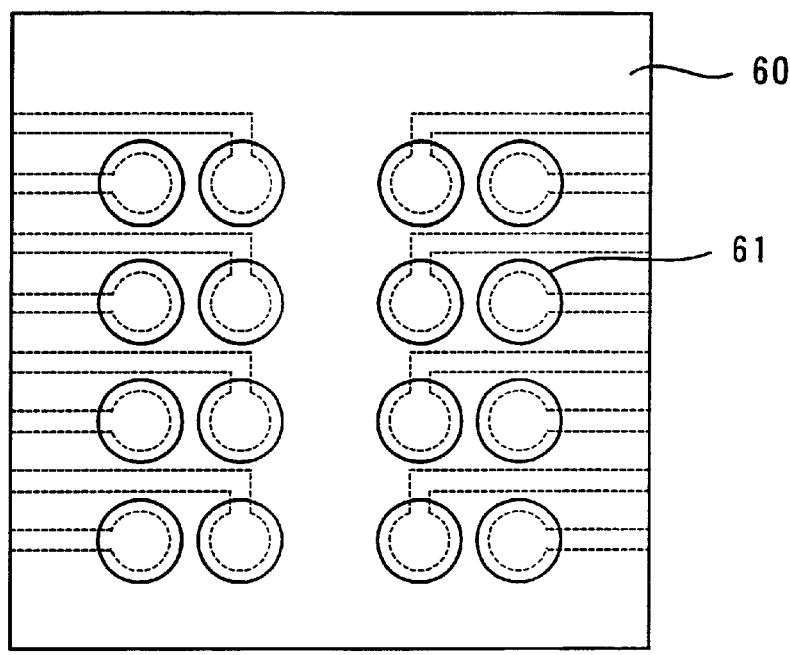
FIGS. 4A and 4B are diagrams showing other structures of the second insulation tape in a semiconductor device according to the embodiment of the present invention.
Figure 4B:
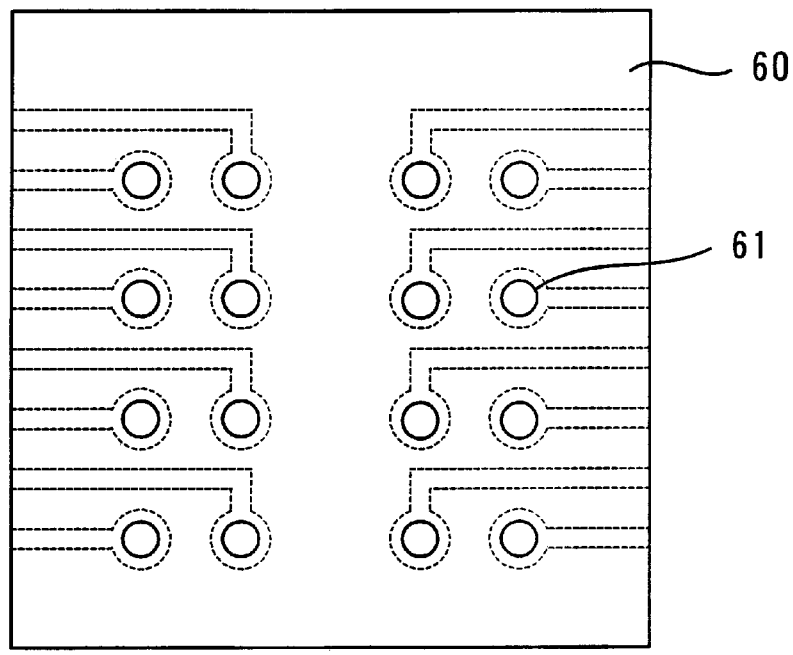

In the above embodiment, the size (diameter) of the opening 61 is substantially the same as that of corresponding land 11A. The diameter of the opening 61 may be substantially the same as that of corresponding solder ball 70. For example, the size of the opening 61 may be larger than that of corresponding land 11A as shown in FIG. 4A, or may be smaller than that of corresponding land 11A as shown in FIG. 4B. Note that broken lines shown in FIGS. 4A and 4B represent a pattern of the lead frame 10. This modified structure allows formation of the solder balls 70 each having different diameter on the same lead frame 10.

The second insulation tape 60 may be affixed onto the lead frame 10 partially. More precisely, the second insulation tape 60 may be affixed only to, for example, interval regions among the regions for the solder balls 70 and their peripheral regions.

Portions of the lead frame 10 except the leads 11 may be etched to a predetermined depth.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H10-356169 filed on Dec. 15, 1998, and including specification, claims, drawings and summary. The disclosure of the above Japanese Patent Application is incorporated herein by reference in its entirety.

What is claimed is:

1. A semiconductor device comprising:

a lead frame having lands prepared for forming external terminals;

a semiconductor chip mounted on a first side of said lead frame;

wires which electrically interconnect said semiconductor chip and said lead frame;

an insulating film, formed on a, second side of said lead frame, the film having openings for exposing predetermined portions of said lead frame, said insulating film comprising an adhesive layer and an insulation layer whose material differs from material of said adhesive layer, said insulating film being adhered on the second side of said lead frame, said insulating film having pre-formed openings, which are arranged to coincide with the lands on the lead frame; and connection terminals formed on said predetermined portions of said lead frame which are left exposed by the openings of said insulation film.

2. The semiconductor device according to claim 1, wherein each of said openings in said insulation film has diameter which is substantially the same as diameter of corresponding connection terminal.

3. The semiconductor device according to claim 2, wherein said insulation film has at least one of thermosetting property and thermo plasticity.

4. The semiconductor device according to claim 1, wherein said connection terminals are made of solder.

5. The semiconductor device according to claim 3, wherein said insulation film is smaller than said lead frame.

* * * * *